(12) United States Patent
Fang et al.

(10) Patent No.: US 11,508,837 B2
(45) Date of Patent: Nov. 22, 2022

(54) EPITAXIAL STRUCTURE FOR HIGH-ELECTRON-MOBILITY TRANSISTOR AND METHOD FOR MANUFACTURING THE SAME

(71) Applicant: XIAMEN SANAN INTEGRATED CIRCUIT CO., LTD., Xiamen (CN)

(72) Inventors: Yutao Fang, Xiamen (CN); Boting Liu, Xiamen (CN); Nien-Tze Yeh, Xiamen (CN); Kaixuan Zhang, Xiamen (CN)

(73) Assignee: Xiamen Sanan Integrated Circuit Co., Ltd., Fujian (CN)

( * ) Notice: Subject to any disclaimer, the term of this patent is extended or adjusted under 35 U.S.C. 154(b) by 189 days.

(21) Appl. No.: 16/947,180

(22) Filed: Jul. 22, 2020

(65) Prior Publication Data
US 2020/0350426 A1    Nov. 5, 2020

Related U.S. Application Data

(63) Continuation-in-part of application No. PCT/CN2019/073026, filed on Jan. 24, 2019.

(30) Foreign Application Priority Data

Jan. 25, 2018 (CN) .......................... 201810071551.5

(51) Int. Cl.
*H01L 29/778* (2006.01)
*H01L 21/02* (2006.01)
(Continued)

(52) U.S. Cl.
CPC ...... *H01L 29/7785* (2013.01); *H01L 21/0242* (2013.01); *H01L 21/0251* (2013.01);
(Continued)

(58) Field of Classification Search
CPC ......... H01L 21/02458; H01L 21/02507; H01L 21/0251; H01L 21/0254; H01L 21/0262;
(Continued)

(56) References Cited

U.S. PATENT DOCUMENTS

2014/0209862 A1* 7/2014 Ikuta ................. H01L 21/02507
257/190

* cited by examiner

*Primary Examiner* — Julia Slutsker
(74) *Attorney, Agent, or Firm* — Rosenberg, Klein & Lee

(57) ABSTRACT

An epitaxial structure for a high-electron-mobility transistor includes a substrate, a nucleation layer, a buffer layered unit, a channel layer, and a barrier layer sequentially stacked on one another in such order. The buffer layered unit includes at least one multiple quantum well structure containing a plurality of p-i-n heterojunction stacks. Each of the p-i-n heterojunction stacks includes p-type, i-type, and n-type layers which are alternately stacked along a direction away from the nucleation layer, and which are made of materials respectively represented by chemical formulas of $Al_xGa_{(1-x)}N$, $Al_yGa_{(1-y)}N$, and $Al_zGa_{(1-z)}N$. For each of the p-i-n heterojunction stacks, x gradually decreases and z gradually increases along the direction away from the nucleation layer, and y is consistent and ranges from 0 to 0.7.

20 Claims, 5 Drawing Sheets

(51) Int. Cl.
*H01L 29/15* (2006.01)
*H01L 29/20* (2006.01)
*H01L 29/205* (2006.01)
*H01L 29/66* (2006.01)

(52) U.S. Cl.
CPC ...... *H01L 21/0254* (2013.01); *H01L 21/0262* (2013.01); *H01L 21/02378* (2013.01); *H01L 21/02381* (2013.01); *H01L 21/02458* (2013.01); *H01L 21/02507* (2013.01); *H01L 29/157* (2013.01); *H01L 29/2003* (2013.01); *H01L 29/205* (2013.01); *H01L 29/66462* (2013.01)

(58) Field of Classification Search
CPC . H01L 29/157; H01L 29/2003; H01L 29/205; H01L 29/66462; H01L 29/7786
See application file for complete search history.

EPITAXIAL STRUCTURE FOR HIGH-ELECTRON-MOBILITY TRANSISTOR AND METHOD FOR MANUFACTURING THE SAME

CROSS-REFERENCE TO RELATED APPLICATION

This application is a bypass continuation-in-part (CIP) application of PCT International Application No. PCT/CN2019/073026, filed on Jan. 24, 2019, which claims priority of Chinese Invention Patent Application No. 201810071551.5, filed on Jan. 25, 2018. The entire content of each of the International and Chinese patent applications is incorporated herein by reference.

FIELD

This disclosure relates to an epitaxial structure made of semiconductor materials and a method for manufacturing the same, and more particularly to an epitaxial structure adapted for used in a high-electron-mobility transistor (HEMT) which includes a high resistance buffer layered unit having a multiple quantum well structure and a method for manufacturing the same.

BACKGROUND

A gallium nitride (GaN)-based high-electron-mobility transistor (HEMT) is a heterojunction field-effect transistor including a barrier layer (i.e., a doped layer) made of aluminum gallium nitride (AlGaN) and a channel layer (i.e., an undoped layer) made of GaN. A two-dimensional electron gas may be formed at an interface between the barrier layer and the channel layer (i.e., a heterojunction) since a relatively large discontinuity of spontaneous polarization and piezoelectronic polarization occurs at the heterojunction. Properties of the GaN-based HEMT might largely depend on the composition (such as Al and Ga contents), thickness, and crystal quality of the barrier layer. Due to advantages such as a relatively high concentration of the two-dimensional electron gas, a high rate of electron migration, and a high disruptive strength, the HEMT is widely used in high-pressure, high-frequency and high-temperature microwave devices, which are applied in various fields such as aerospace, radar technology, medicine, microwave transmission, etc.

An epitaxial growth of a semi-insulating GaN-based buffer layer with a high quality is one of the key factors to manufacture a GaN-based HEMT device with satisfactory properties. It is noted that a GaN-based buffer layer having a relatively low quality is prone to electrical leakage, which might adversely affect a pinch-off performance of the resultant HEMT device, reducing the ability of a gate-voltage to control a channel current, thereby deteriorating an overall performance of the HEMT device. The electrical leakage of the GaN-based buffer layer might also increase heat generation, which adversely affects a reliability and service life of the HEMT device. In addition, a dislocation density of the GaN-based buffer layer would directly affect the rate of electron migration of the two-dimensional electron gas in the HEMT device and a turn-on resistance thereof.

A GaN-based epitaxial structure for the HEMT device grown using metal organic chemical vapor deposition (MOCVD) generally has a relatively high background electron concentration (e.g., $10^{17}/cm^3$) and exhibits a relatively low resistance. A conventional method for manufacturing a GaN-based epitaxial structure with a high resistance aims to control epitaxial growth parameters (e.g., pressure of reaction chamber, growth temperature, growth rate, V/III ratio, etc.) during the MOCVD process, so as to increase an amount of p-type dopant in the GaN-based epitaxial structure and/or a concentration of defects, thereby reducing the background electron concentration. However, the GaN-based epitaxial structure manufactured by such method may have an increased amount of defects and impurities, which greatly lowers the overall quality thereof. In addition, the conventional method requires a high dependency on equipments to control the epitaxial growth parameters and thus, has a low reproducibility.

Another conventional method for manufacturing the GaN-based epitaxial structure with a high resistance is conducted by virtue of introducing metals such as iron, chromium, and magnesium during epitaxial growth of the GaN-based epitaxial structure in a reaction chamber, so as to generate a high level of defects and/or provide electron holes for receiving excessive electrons. However, the metals might have memory effect, which would cause contamination of the reaction chamber, and the introduced impurities might lower the rate of electron mobility of the two-dimensional electron gas in the GaN-based epitaxial structure, which adversely affect the properties of the resultant HEMT device.

SUMMARY

Therefore, an object of the disclosure is to provide an epitaxial structure for a high-electron-mobility transistor (HEMT) and a method for manufacturing the same that can alleviate or eliminate at least one of the drawbacks of the prior art.

According to a first aspect of the disclosure, the epitaxial structure includes a substrate, and a nucleation layer, a buffer layered unit, a channel layer, and a barrier layer sequentially disposed on the substrate in such order.

The buffer layered unit includes at least one multiple quantum well structure that contains a plurality of p-i-n heterojunction stacks. Each of the p-i-n heterojunction stacks includes a p-type layer that is made of a material represented by a chemical formula of $Al_xGa_{(1-x)}N$, an i-type layer that is made of a material represented by a chemical formula of $Al_yGa_{(1-y)}N$, and an n-type layer that is made of a material represented by a chemical formula of $Al_zGa_{(1-z)}N$. The p-type layers, the i-type layers and the n-type layers in the p-i-n heterojunction stacks are alternately stacked on one another along a direction away from the nucleation layer. For each of the p-i-n heterojunction stacks, x gradually decreases in the p-type layer from a first value to a second value along the direction away from the nucleation layer, y is consistent in the i-type layer, $0 \leq y \leq 0.7$, and z gradually increases in the n-type layer from a third value to a fourth value along the direction away from the nucleation layer. The first value ranges from 0.1 to 0.9, the second value ranges from 0 to 0.7, the third value ranges from 0 to 0.7, and the fourth value ranges from 0.1 to 0.9.

According to a second aspect of the disclosure, the method for manufacturing the abovementioned epitaxial structure includes the steps of:
 a) forming the nucleation layer on the substrate;
 b) forming the buffer layered unit on the nucleation layer, the buffer layered unit including the at least one multiple quantum well structure that contains the p-i-n heterojunction stacks, each of which is formed by the sub-steps of:

b1) forming, by polarization doping, the p-type layer that is made of the material represented by the chemical formula of $Al_xGa_{(1-x)}N$, in which x gradually decreases from a first value to a second value along the direction away from the nucleation layer, the first value ranging from 0.1 to 0.9, the second value ranging from 0 to 0.7, b2) epitaxially growing the i-type layer that is made of the material represented by the chemical formula of $Al_yGa_{(1-y)}N$, in which y is consistent and ranges from 0 to 0.7, b3) forming, by polarization doping, the n-type layer that is made of a material represented by the chemical formula of $Al_zGa_{(1-z)}N$, in which z gradually increases from a third value to a fourth value along the direction away from the nucleation layer, the third value ranging from 0 to 0.7, and the fourth value ranging from 0.1 to 0.9;

c) forming the channel layer on the buffer layered unit; and d) forming the barrier layer on the channel layer.

BRIEF DESCRIPTION OF THE DRAWINGS

Other features and advantages of the disclosure will become apparent in the following detailed description of the embodiments with reference to the accompanying drawings, in which.

DETAILED DESCRIPTION

Figure 1:
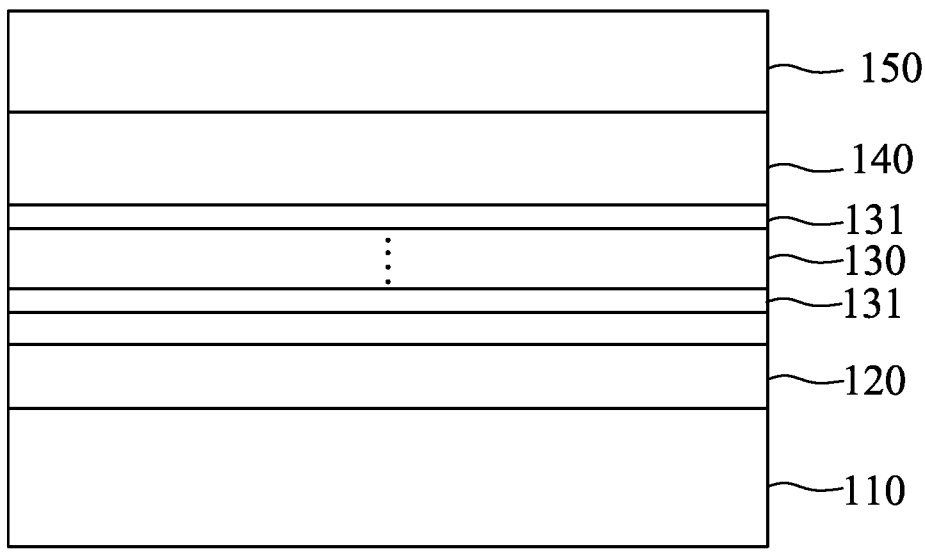
FIG. 1 is a schematic view illustrating a first embodiment of an epitaxial structure according to the disclosure.

Before the disclosure is described in greater detail, it should be noted that where considered appropriate, reference numerals have been repeated among the figures to indicate corresponding or analogous elements, which may optionally have similar characteristics.

Figure 2:
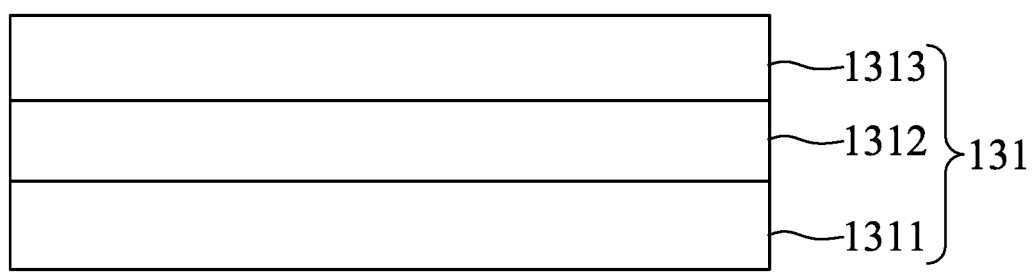
FIG. 2 is a schematic view illustrating a p-i-n heterojunction stack of the first embodiment of the epitaxial structure according to the disclosure.

Referring to FIGS. 1 and 2, a first embodiment of an epitaxial structure for a high-electron mobility transistor (HEMT) according to the disclosure includes a substrate 110, and a nucleation layer 120, a buffer layered unit 130, a channel layer 140, and a barrier layer 150 sequentially disposed on the substrate 110 in such order.

The substrate 110 may be made of silicon, silicon carbide (SiC), or sapphire.

The nucleation layer 120 may be made of gallium nitride (GaN) or aluminum nitride (AlN).

The buffer layered unit 130 includes at least one multiple quantum well structure that contains a plurality of p-i-n heterojunction stacks 131. Each of the p-i-n heterojunction stacks 131 includes a p-type layer 1311 that is made of a material represented by a chemical formula of $Al_xGa_{(1-x)}N$, an i-type layer 1312 that is made of a material represented by a chemical formula of $Al_yGa_{(1-y)}N$, and an n-type layer 1313 that is made of a material represented by a chemical formula of $Al_zGa_{(1-z)}N$. The p-type layers, the i-type layers, and the n-type layers 1311, 1312, 1313 in the p-i-n heterojunction stacks 131 are alternately stacked on one another along a direction away from the nucleation layer 120.

For each of the p-i-n heterojunction stacks 131, x gradually decreases in the p-type layer 1311 from a first value ranging between 0.1 and 0.9 to a second value ranging between 0 and 0.7 along a direction away from the nucleation layer 120; y is consistent in the i-type layer 1312 and ranges from 0 to 0.7; and z gradually increases in the n-type layer 1313 from a third value ranging between 0 to 0.7 to a fourth value ranging between 0.1 to 0.9 along the direction away from the nucleation layer 120.

In certain embodiments, the multiple quantum well structure includes 5 to 30 of the p-i-n heterojunction stacks 131. For each of the p-i-n heterojunction stacks 131, the p-type layer 1311 may have a thickness ranging from 5 nm to 50 nm, the i-type layer 1312 may have a thickness ranging from 5 nm to 50 nm, and the n-type layer 1313 may have a thickness ranging from 5 nm to 80 nm.

The channel layer 140 is made of GaN and may be formed under conditions including a surface temperature ranging from 1000° C. to 1150° C., and a pressure ranging from 100 mbar to 400 mbar. In certain embodiments, the channel layer 140 may have a thickness ranging from 50 nm to 500 nm.

The barrier layer 150 may be made of a material represented by a chemical formula of $Al_tGa_{(1-t)}N$, where $0.15<t<0.3$. The barrier layer 150 may be formed under a surface temperature ranging from 1000° C. to 1150° C. The barrier layer 150 may have a thickness ranging from 10 nm to 35 nm.

According to the disclosure, a method for manufacturing the first embodiment of the epitaxial structure includes the following steps a) to d).

In step a), the nucleation layer 120 is formed on the substrate 110 using, e.g., a metal organic chemical vapor deposition (MOCVD) process.

In certain embodiments, the nucleation layer 120 may be an AlN layer that is grown under a relatively high surface temperature ranging from 1000° C. to 1200° C., and may have a thickness ranging from 100 nm to 500 nm. In other embodiments, the nucleation layer 120 may be an AlN layer that is grown under a relatively low surface temperature ranging from 600° C. to 800° C., and may have a thickness ranging from 10 nm to 50 nm. In still certain embodiments, the nucleation layer 120 may be a GaN layer that is grown under a relatively low surface temperature ranging from 450° C. to 550° C., and may have a thickness ranging from 10 nm to 30 nm.

In step b), the buffer layered unit 130 including at least one multiple quantum well structure that contains the p-i-n heterojunction stacks 131 is formed on the nucleation layer 120. Each of the p-i-n heterojunction stacks 131 is formed by the following sub-steps b1) to b3).

In sub-step b1), the p-type layer 1311 made of a material represented by a chemical formula of $Al_xGa_{(1-x)}N$, is formed by polarization doping, where x gradually decreases from a first value ranging between 0.1 and 0.9 to a second value ranging between 0 and 0.7 along the direction away from the nucleation layer 120.

In certain embodiments, the p-type layer 1311 may be formed under the following conditions: a flow rate of an aluminum source (such as trimethyl aluminum (TMAl) and triethyl aluminum (TEAl)) gradually decreasing from a level ranging between 50 sccm and 600 sccm to a level ranging between 0 sccm and 500 sccm, a flow rate of a gallium source (such as trimethyl gallium (TMGa) and triethyl gallium (TEGa)) gradually increasing from a level ranging between 20 sccm and 80 sccm to a level ranging between 25 sccm and 400 sccm, a flow rate of ammonia ($NH_3$) ranging from 1500 sccm to 20000 sccm, a surface temperature ranging from 1000° C. to 1100° C., and a growth rate ranging from 0.5 µm/h to 3 µm/h. Due to the polarization effect, the p-type layer 1311 has a gradually decreasing Al content.

In sub-step b2), the i-type layer 1312 made of a material represented by a chemical formula of $Al_yGa_{(1-y)}N$ is grown epitaxially on the p-type layer 1311, where y is consistent and ranges from 0 to 0.7.

In certain embodiments, the i-type layer 1312 is formed under the following conditions: a flow rate of TMAl ranging from 0 sccm to 500 sccm, a flow rate of TMGa ranging from 25 sccm to 400 sccm, a flow rate of $NH_3$ ranging from 1500 sccm to 30000 sccm, a surface temperature ranging from 1000° C. to 1100° C., and a growth rate ranging from 1 µm/h to 3 µm/h.

In sub-step b3), the n-type layer 1313 made of a material represented by a chemical formula of $Al_zGa_{(1-z)}N$ is formed on the i-type layer 1312 by polarization doping, where z gradually increases from a third value ranging between 0 and 0.7 to a fourth value ranging between 0.1 to 0.9 along the direction away from the nucleation layer 120.

In certain embodiments, the n-type layer 1313 is formed under the following conditions: a flow rate of TMAl gradually increasing from a level ranging between 0 sccm and 500 sccm to a level ranging between 50 sccm and 600 sccm, a flow rate of TMGa gradually decreasing from a level ranging between 25 sccm and 400 sccm to a level ranging between 20 sccm and 80 sccm, a flow rate of $NH_3$ ranging from 1500 sccm to 20000 sccm, a surface temperature ranging from 1000° C. to 1100° C., and a growth rate ranging from 0.5 µm/h to 3 µm/h. Due to the polarization effect, the n-type layer 1313 has a gradually increasing Al content.

In certain embodiments, the sub-steps b1) to b3) may be repeated for predetermined times (e.g., 5 to 30 times), so as to obtain the multiple quantum well including 5 to 30 of the p-i-n heterojunction stacks 131.

In step c), the channel layer 140 is formed on the buffer layered unit 130. Step c) may be performed under the following conditions: a flow rate of TMGa ranging from 60 sccm to 400 sccm, a flow rate of $NH_3$ ranging from 1500 sccm to 30000 sccm, a surface temperature ranging from 950° C. to 1100° C., and a growth rate ranging from 0.5 µm/h to 3 µm/h.

In step d), the barrier layer 150 is formed on the channel layer 140. Step d) may be performed under the following conditions: a flow rate of TMAl ranging from 80 sccm to 250 sccm, a flow rate of TMGa ranging from 60 sccm to 150 sccm, a flow rate of $NH_3$ ranging from 6000 sccm to 12000 sccm, a surface temperature ranging from 1020° C. to 1100° C., and a growth rate ranging from 0.3 µm/h to 3 µm/h.

The detailed growth conditions for forming each layer of the first embodiment of the epitaxial structure is described below.

To be specific, in step a), a SiC substrate 110 having a chemical mechanical planarization (CMP) polished silicon (Si) surface and an optically polished carbon (C) surface and having a diameter of 6 inches and a thickness of 500 µm, is first subjected to a heating treatment at 1050° C. for 10 minutes so as to remove oxidants and impurities adsorbed on the stepped surface and to expose the stepped surface. Next, the nucleation layer 120 made of AlN and having a thickness of around 150 nm is formed on the exposed stepped surface of the SiC substrate 110 using MOCVD, which is performed under the following conditions: a surface temperature of 1100° C., a flow rate of TMAl being 250 sccm, a flow rate of $NH_3$ being 3000 sccm, a pressure of 70 mbar, a growth rate of 0.3 µm/h, and a growth time of 30 minutes.

In step b), the buffer layered unit 130 including one multiple quantum well structure having an average aluminum content of 5 mol %, is formed on the nucleation layer 120 using MOCVD. The multiple quantum well structure contains 20 of the p-i-n heterojunction stacks 131, each of which is formed as follows.

In substep b1), the p-type layer 1311, which is made of graded $Al_xGa_{(1-x)}N$, x gradually decreasing from 0.15 to 0.05 along the direction away from the nucleation layer 120, and which has a thickness of 15 nm, is formed by polarization doping under the following conditions: a flow rate of TMAl linearly decreasing from 200 sccm to 50 sccm, a flow rate of TMGa linearly increasing from 150 sccm to 300 sccm, a flow rate of $NH_3$ increasing from 9000 sccm to 15000 sccm (i.e., the aluminum content decreasing gradually form 15 mol % to 5 mol %), a surface temperature of 1050° C., and a growth time of 30 seconds.

In substep b2), the i-type layer 1312, which is made of GaN and has a thickness of 30 nm, is formed on the p-type layer 1311 under the following conditions: a flow rate of TMGa being 200 sccm, a flow rate of $NH_3$ being 20000 sccm, a surface temperature of 1050° C., and a growth time of 1 minute.

In substep b3), the n-type layer 1313, which is made of graded $Al_zGa_{(1-z)}N$, z gradually increasing from 0.05 to 0.15 along the direction away from the nucleation layer 120, and which has a thickness of 15 nm, is formed on the i-type layer 1312 by polarization doping under the following conditions: a flow rate of TMAl linearly increasing from 50 sccm to 200 sccm, a flow rate of TMGa linearly decreasing from 300 sccm to 200 sccm, a flow rate of $NH_3$ decreasing from 15000 sccm to 9000 sccm (i.e., the aluminum content gradually increasing from 5 mol % to 15 mol %), a surface temperature of 1050° C., and a growth time of 30 seconds.

Figure 5:
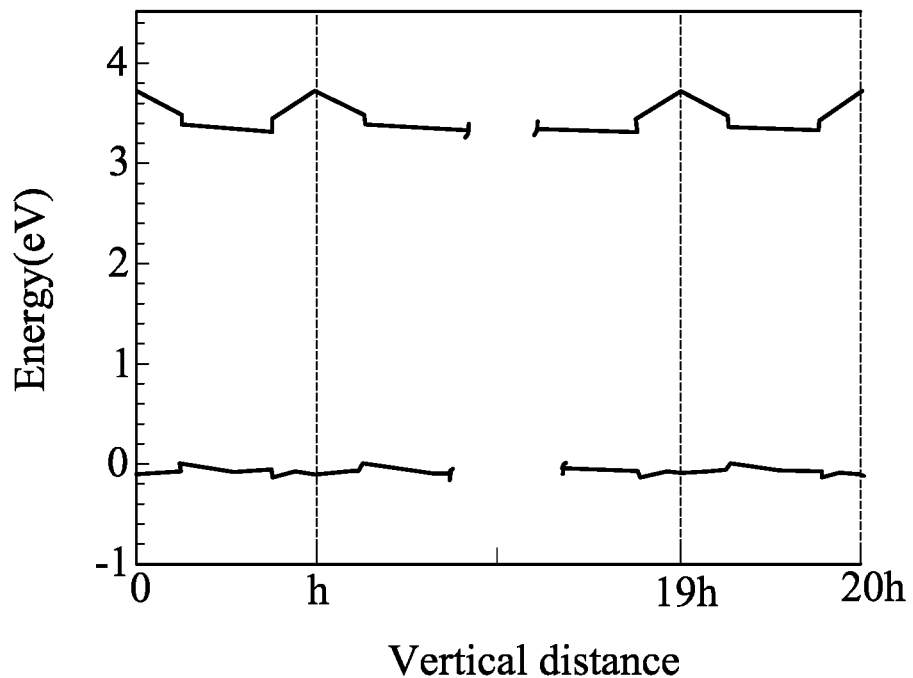
FIG. 5 is a chart illustrating an energy band gap as a function of thickness of a buffer layered unit of the first embodiment.

The sub-steps b1) to b3) are repeated 20 times to obtain 20 of the p-i-n heterojunction stacks 131, and the resultant buffer layered unit 130 has a total thickness of 1.2 µm and an energy band gap as shown in FIG. 5.

Referring to FIG. 5, "h" represents the thickness (i.e., the vertical distance measured from the nucleation layer 120) of each of the p-i-n heterojunction stacks 131. That is, h in this embodiment is 60 nm (i.e., the p-type layer 1311 is 15 nm, the i-type layer 1312 is 30 nm, and the n-type layer 1313 is 15 nm). For each of the p-i-n heterojunction stacks 131, the p-type layer 1311 has a decreasing energy band gap (i.e., a line with a negative slope) due to a gradually decreasing aluminum content (from 15% to 5%) thereof, the i-type layer has a consistent energy band gap (i.e., the substantially horizontal line), and the n-type layer 1313 has an increasing energy band gap (i.e., a line with a positive slope) due to a gradually increasing aluminum content (from 5% to 15%) thereof. It can be seen that, the overall energy band gap of the buffer layered unit 130 is relatively low due to the low average aluminum content (5%) thereof. With a low energy band gap, the buffer layered unit 130 may serve as a back barrier layer, and may prevent a concentration of two-dimensional electron gas to be formed from being adversely affected.

In step c), the channel layer 140 having a thickness of 300 nm is formed on the buffer layered unit 130 under the following conditions: a flow rate of TMGa being 200 sccm, a flow rate of NH3 being 30000 sccm, a surface temperature of 1060° C., a pressure of 200 mbar, and a growth rate of 2 μm/h.

In step d), the barrier layer 150, which is made of $Al_{0.25}Ga_{0.75}N$ and has a thickness of 25 nm, is formed on the channel layer 140 under the following conditions: a flow rate of TMAl being 200 sccm, a flow rate of TMGa being 90 sccm, a flow rate of $NH_3$ being 9000 sccm, a surface temperature of 1060° C., a pressure of 75 mbar, a growth rate of 0.6 μm/h, and a growth time of 2.5 minutes.

Figure 3:
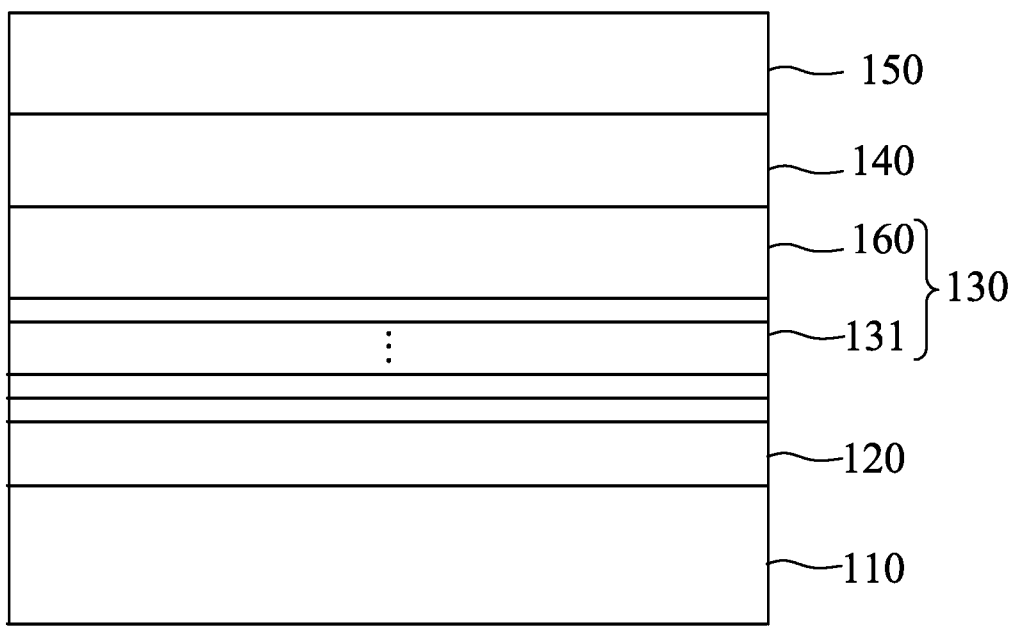
FIG. 3 is a schematic view illustrating a second embodiment of the epitaxial structure according to the disclosure.

Referring to FIGS. 3 and 5, a second embodiment of the epitaxial structure of the disclosure is similar to the first embodiment, except that the buffer layered unit 130 in the second embodiment further includes a high-resistance GaN layer 160 which is sandwiched between the multiple quantum well structure and the channel layer 140. That is, the multiple quantum well structure and the high resistance GaN layer 160 cooperatively form the buffer layered unit 130. The high-resistance GaN layer 160 may have a thickness ranging from 500 nm to 3000 nm.

The method for manufacturing the second embodiment of the epitaxial structure is similar to that for manufacturing the first embodiment, except that the method for manufacturing the second embodiment further includes, before step c) and after step b), a step e) of forming the high resistance GaN layer 160 on the multiple quantum well structure, which may be performed under the following conditions: a flow rate of TMGa ranging from 100 sccm to 500 sccm, a flow rate of $NH_3$ ranging from 10000 sccm to 15000 sccm, a surface temperature ranging from 950° C. to 1000° C., a pressure ranging from 10 mbar to 80 mbar, and a growth rate ranging from 1.5 μm/h to 3 μm/h.

The detailed growth conditions for forming each layer of the second embodiment of the epitaxial structure is described below.

To be specific, in step a), a silicon substrate 110 having a stepped surface, a diameter of 6 inches and a thickness of 1 mm is first subjected to a heating treatment at 1050° C. for 15 minutes, so as to remove oxidants and impurities adsorbed on the stepped surface and to expose the stepped surface. Next, the nucleation layer 120 made of AlN and having a thickness of around 200 nm is formed on the exposed stepped surface of the silicon substrate 110 using MOCVD, which is performed under similar conditions for forming the nucleation layer 120 of the first embodiment, except that the growth time is increased to 40 minutes.

In step b), the buffer layered unit 130, which includes one multiple quantum well structure having an average aluminum content of 20% is formed on the nucleation layer 120 using MOCVD. The multiple quantum well structure contains 15 of the p-i-n heterojunction stacks 131, each of which is formed as follows.

In substep b1), the p-type layer 1311, which is made of graded $Al_xGa_{(1-x)}N$, x gradually decreasing from 0.75 to 0.05 along the direction away from the nucleation layer 120, and which has a thickness of 15 nm, is formed by polarization doping under the following conditions: a flow rate of TMAl linearly decreasing from 450 sccm to 50 sccm, a flow rate of TMGa linearly increasing from 30 sccm to 300 sccm, a flow rate of $NH_3$ increasing from 1500 sccm to 10000 sccm (i.e., the aluminum content decreasing gradually from 75 mol % to 5 mol %), a surface temperature of 1050° C., and a growth time of 45 seconds.

In substep b2), the i-type layer 1312, which is made of GaN and has a thickness of 30 nm, is formed on the p-type layer 1311 under the same conditions as those for forming the i-type layer 1312 of the first embodiment.

In substep b3), the n-type layer 1313, which is made of graded $Al_zGa_{(1-z)}N$, z gradually increasing from 0.05 to 0.75 along the direction away from the nucleation layer 120, and which has a thickness of 15 nm, is formed on the i-type layer 1312 by polarization doping under the following conditions: a flow rate of TMAl linearly increasing from 50 sccm to 450 sccm, a flow rate of TMGa linearly decreasing from 300 sccm to 30 sccm, a flow rate of $NH_3$ decreasing from 10000 sccm to 1500 sccm (i.e., the aluminum content increasing gradually from 5 mol % to 75 mol %), a surface temperature of 1050° C., and a growth time of 45 seconds.

Figure 6:
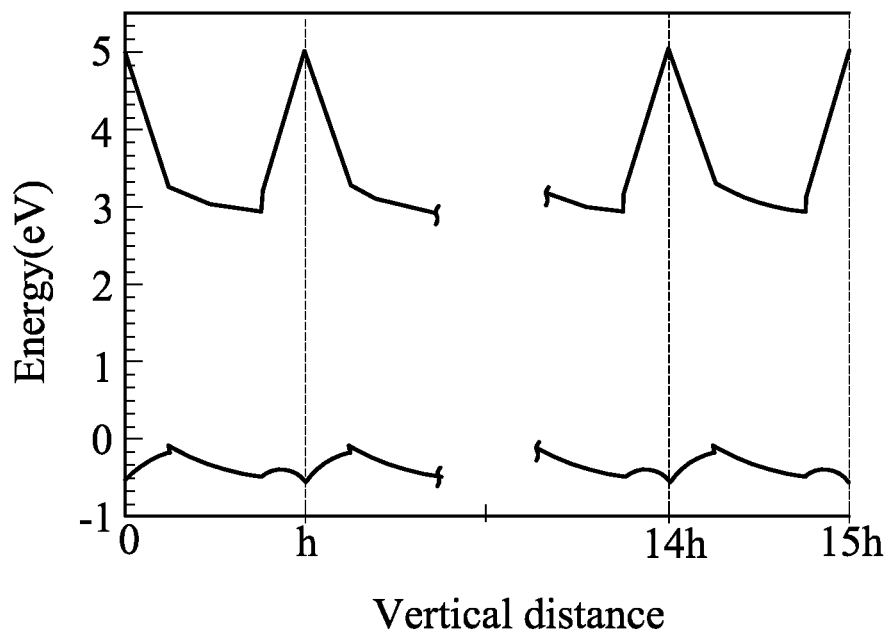
FIG. 6 is a chart illustrating an energy band gap as a function of thickness of a buffer layered unit of the second embodiment.

The substeps b1) to b3) are repeated 15 times to obtain 15 of the p-i-n heterojunction stacks 131, and the resultant buffer layered unit 130 has a total thickness of 0.9 μm and an energy band gap as shown in FIG. 6.

Referring to FIG. 6, it can be seen that the buffer layered unit 130 of the second embodiment has a higher energy band gap compared to that of the first embodiment since the buffer layered unit 130 of the second embodiment has a higher average aluminum content (20 mol %). In addition, as compared to the first embodiment, the p-type layer 1311 of each the p-i-n heterojunction stacks 131 in the second embodiment has an energy band gap which decreases more rapidly (i.e., a line having a steeper negative slope) since the aluminum content of the p-type layer 1311 decreases from 75 mol % to 5 mol % within the same thickness (i.e., 15 nm) as that of the p-type layer 1311 of the first embodiment. The n-type layer 1313 has an energy band gap which increases more rapidly (i.e., a line having a steeper positive slope) since the aluminum content in the n-type layer 1313 increases from 5 mol % to 75 mol % within the same thickness (i.e., 15 nm) as that of the n-type layer 1313 of the first embodiment. The i-type layer 1312 has a consistent energy band gap, which is represented by a substantially horizontal line. The compressive strain to be built due to the lattice mismatch among the nucleation layer 120, the buffer layered unit 130, and the channel layer 140 is used to compensate the tensile strain generated due to thermal expansion mismatch between GaN and silicon during a cooling process after the epitaxial growth under high temperature.

In step e), the high-resistance GaN layer 160, which has a thickness of 2000 nm, is formed on the buffer layered unit 130 under the following conditions: a flow rate of TMGa being 200 sccm, a flow rate of $NH_3$ being 120000 sccm, a surface temperature of 980° C., a pressure of 50 mbar, a growth rate of 2.5 μm/h, and a growth time of 50 minutes.

In step c), the channel layer 140, which has a thickness of 200 nm, is formed on the high-resistance GaN layer 160 under similar conditions as those for forming the channel layer 140 of the first embodiment.

In step d), the barrier layer 150, which is made of $Al_{0.25}Ga_{0.75}N$ and has a thickness of 25 nm, is formed on the channel layer 140 under similar conditions as those for forming the barrier layer 150 of the first embodiment.

Figure 4:
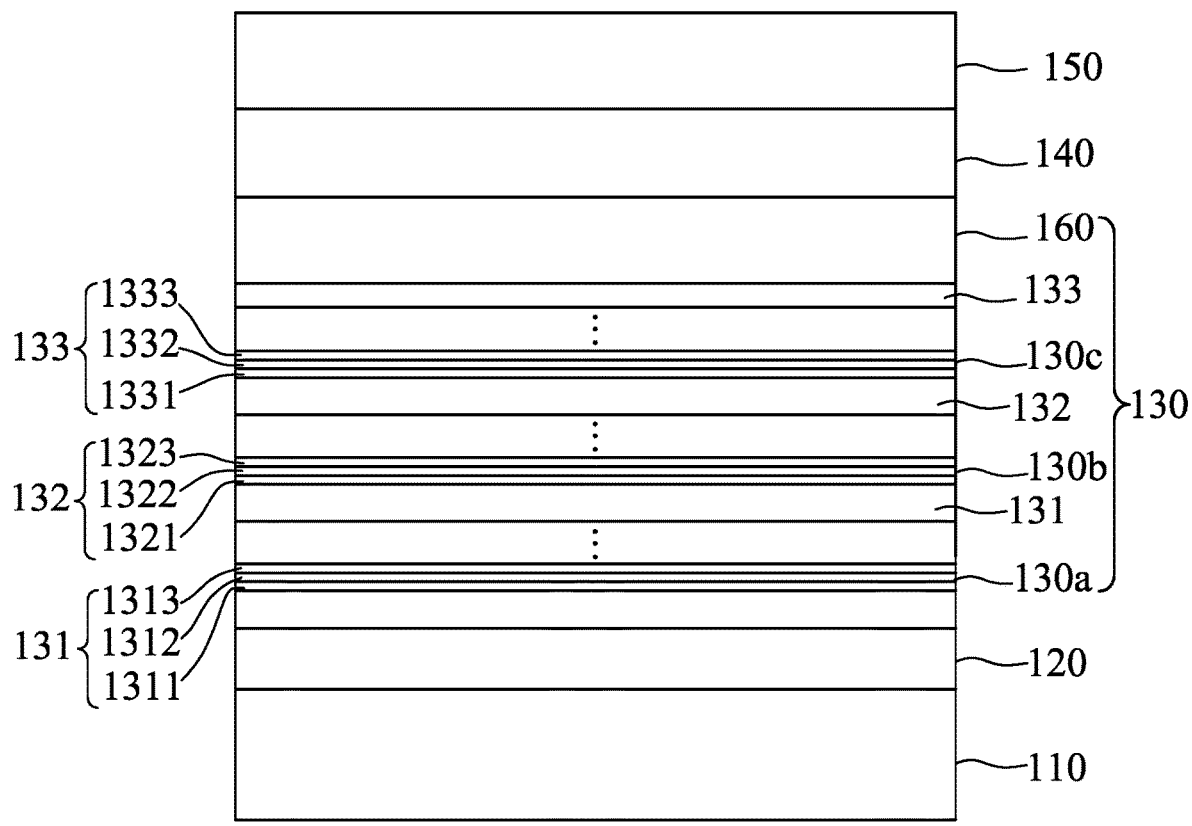
FIG. 4 is a schematic view illustrating a third embodiment of the epitaxial structure according to the disclosure.

Referring to FIG. 4, a third embodiment of the epitaxial structure according to the disclosure is similar to the second embodiment, except that the buffer layered unit 130 of the third embodiment includes a plurality of multiple quantum well structures (i.e. first to third multiple quantum well structures 130a, 130b, 130c), each of which has an average aluminum content, and the aluminum contents in the multiple quantum well structures decrease in a stepwise manner along the direction away from the nucleation layer 120.

The detailed growth conditions for forming each layer of the third embodiment of the epitaxial structure is described below.

To be specific, in step a), the nucleation layer 120 is formed on the silicon substrate 110 under the same conditions as those for forming the nucleation layer 120 of the second embodiment.

In step b), the buffer layered unit 130, which includes the first multiple quantum well structure 130a having an average aluminum content of 72.5 mol %, the second multiple quantum well structure 130b having an average aluminum content of 47.5 mol %, and the third multiple quantum well structure 130c having an average aluminum content of 22.5 mol %, is formed on the nucleation layer 120 using MOCVD.

To be specific, the first multiple quantum well structure 130a is firstly formed on the nucleation layer 120, and contains 15 of the p-i-n heterojunction stacks 131, each of which is formed as follows.

In substep b1), the p-type layer 1311, which is made of graded $Al_xGa_{(1-x)}N$, x gradually decreasing from 0.9 to 0.7 along the direction away from the nucleation layer 120, and which has a thickness of 15 nm, is formed by polarization doping under the following conditions: a flow rate of TMAl linearly decreasing from 450 sccm to 350 sccm, a flow rate of TMGa linearly increasing from 20 sccm to 30 sccm, a flow rate of $NH_3$ increasing from 1500 sccm to 2000 sccm (i.e., the aluminum content decreasing gradually from 90 mol % to 70 mol %), a surface temperature of 1050° C., and a growth time of 80 seconds.

In substep b2), the i-type layer 1312, which is made of $Al_{0.65}Ga_{0.35}N$ (i.e., $Al_yGa_{(1-y)}N$, where y=0.65) and has a thickness of 30 nm, is formed on the p-type layer 1311 under the following conditions: a flow rate of TMAl being 350 sccm, a flow rate of TMGa being 38 sccm, and a flow rate of $NH_3$ being 1500 sccm, a surface temperature of 1050° C., and a growth time of 3 minutes.

In substep b3), the n-type layer 1313, which is made of graded $Al_zGa_{(1-z)}N$, z gradually increasing from 0.7 to 0.9 along the direction away from the nucleation layer 120, and which has a thickness of 15 nm, is formed on the i-type layer 1312 by polarization doping under the following conditions: a flow rate of TMAl linearly increasing from 350 sccm to 450 sccm, a flow rate of TMGa linearly decreasing from 30 sccm to 20 sccm, a flow rate of $NH_3$ decreasing from 2000 sccm to 1500 sccm (i.e., the aluminum content increasing gradually from 70 mol % to 90 mol %), a surface temperature of 1050° C., and a growth time of 80 seconds.

Figure 7:
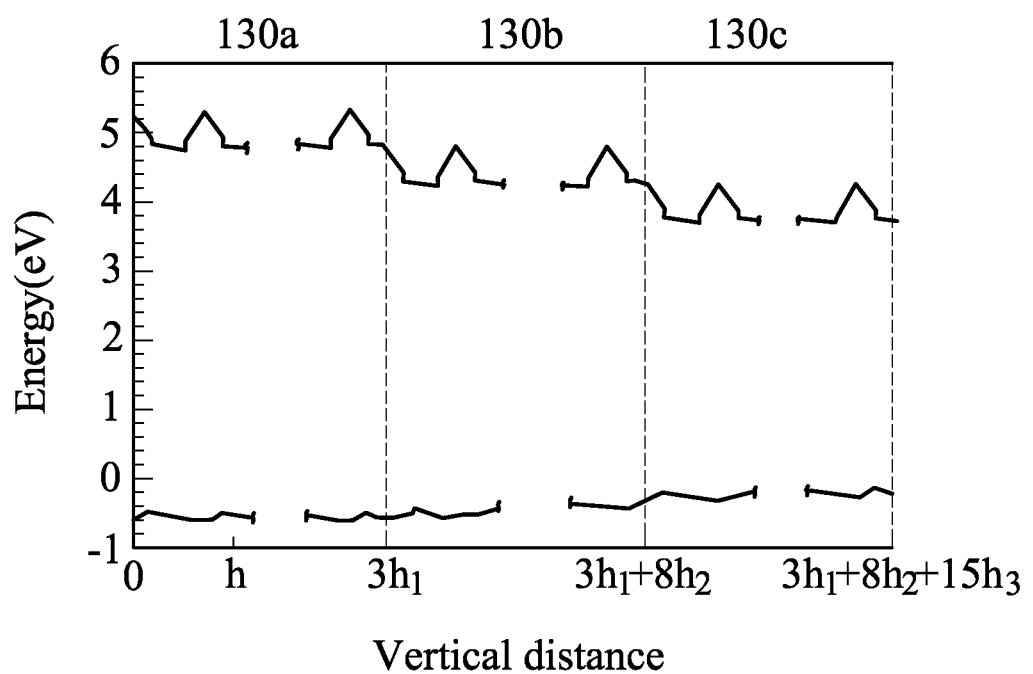
FIG. 7 is a chart illustrating an energy band gap as a function of thickness of a buffer layered unit of the third embodiment.

The substeps b1) to b3) are repeated 3 times to obtain of the p-i-n heterojunction stacks 131, and the resultant first multiple quantum well structure 130a has a total thickness of 180 nm (i.e., "$3h_1$" shown in FIG. 7).

Next, the second multiple quantum well structure 130b is formed on the first multiple quantum well structure 130a, and contains 8 of the p-i-n heterojunction stacks 132, each of which is formed as follows.

In substep b1), the p-type layer 1321, which is made of graded $Al_xGa_{(1-x)}N$, x gradually decreasing from 0.65 to 0.45 along the direction away from the nucleation layer 120, and which has a thickness of 15 nm, is formed by polarization doping under the following conditions: a flow rate of TMAl linearly decreasing from 350 sccm to 300 sccm, a flow rate of TMGa linearly increasing from 38 sccm to 60 sccm, a flow rate of $NH_3$ increasing from 1500 sccm to 1800 sccm (i.e., the aluminum content decreasing gradually from 65 mol % to 45 mol %), a surface temperature of 1050° C., and a growth time of 75 seconds.

In substep b2), the i-type layer 1322, which is made of $Al_{0.4}Ga_{0.6}N$ (i.e., $Al_yGa_{(1-y)}N$, where y=0.4) and has a thickness of 30 nm, is formed on the p-type layer 1321 under the following conditions: a flow rate of TMAl being 300 sccm, a flow rate of TMGa being 74 sccm, a flow rate of $NH_3$ being 3000 sccm, a surface temperature of 1050° C., and a growth time of 2 minutes.

In substep b3), the n-type layer 1323, which is made of graded $Al_zGa_{(1-z)}N$, z gradually increasing from 0.45 to 0.65 along the direction away from the nucleation layer 120, and which has a thickness of 15 nm, is formed on the i-type layer 1322 by polarization doping under the following conditions: a flow rate of TMAl linearly increasing from 300 sccm to 350 sccm, a flow rate of TMGa linearly decreasing from 60 sccm to 38 sccm, a flow rate of $NH_3$ decreasing from 1800 sccm to 1500 sccm (i.e., the aluminum content increasing gradually from 45 mol % to 65 mol %), a surface temperature of 1050° C., and a growth time of 75 seconds.

The substeps b1) to b3) are repeated 8 times to obtain of the p-i-n heterojunction stacks 132, and the resultant second multiple quantum well structure 130b has a total thickness of 480 nm (i.e., "$8h_2$" shown in FIG. 7).

Then, the third multiple quantum well structure 130c is formed on the second multiple quantum well structure 130b, and contains 15 of the p-i-n heterojunction stacks 133, each of which is formed as follows.

In substep b1), the p-type layer 1331, which is made of graded $Al_xGa_{(1-x)}N$, x gradually decreasing from 0.4 to 0.2 along the direction away from the nucleation layer 120, and which has a thickness of 15 nm, is formed by polarization doping under the following conditions: a flow rate of TMAl linearly decreasing from 300 sccm to 250 sccm, a flow rate of TMGa linearly increasing from 74 sccm to 130 sccm, a flow rate of $NH_3$ increasing from 1500 sccm to 2000 sccm (i.e., the aluminum content gradually decreasing from 40 mol % to 20 mol %), a surface temperature of 1050° C., and a growth time of 55 seconds.

In step b2), the i-type layer 1332, which is made of $Al_{0.15}Ga_{0.85}N$ (i.e., $Al_yGa_{(1-y)}N$, where y=0.15) and has a thickness of 30 nm, is formed on the p-type layer 1331 under the following conditions: a flow rate of TMAl being 350 sccm, a flow rate of TMGa being 240 sccm, a flow rate of $NH_3$ being 6000 sccm, a surface temperature of 1050° C., and a growth time of 1 minute.

In substep b3), the n-type layer 1333, which is made of graded $Al_zGa_{(1-z)}N$, z gradually increasing from 0.2 to 0.4 along the direction away from the nucleation layer 120, and which has a thickness of 15 nm, is formed on the i-type layer 1332 by polarization doping under the following conditions: a flow rate of TMAl linearly increasing from 250 sccm to 300 sccm, a flow rate of TMGa linearly decreasing from 130 sccm to 74 sccm, a flow rate of $NH_3$ decreasing from 2000 sccm to 1500 sccm (i.e., the aluminum content increasing gradually from 20 mol % to 40 mol %), a surface temperature of 1050° C., and a growth time of 55 seconds.

The substeps b1) to b3) are repeated 15 times to obtain 15 of the p-i-n heterojunction stacks 133, and the resultant third multiple quantum well structure 130c has a total thickness of 0.9 μm (i.e., "$15h_3$" shown in FIG. 7).

Referring to FIG. 7, it can be seen that an energy band gap of the buffer layered unit 130 of the third embodiment decreases with an increased thickness thereof (i.e., in the direction away from the nucleation layer 120). As the average aluminum contents in the multiple quantum well structures 130a, 130b, 130c decrease, the energy band gap of the buffer layered unit 130 decreases correspondingly. By forming the buffer layered unit 130 that includes a plurality of multiple quantum well structures having graded average aluminum contents, the tensile strain generated due to thermal expansion mismatch between GaN and silicon during a cooling process after the epitaxial growth under high temperature may be effectively compensated by the multiple quantum well structures 130*a*, 130*b*, 130*c* of the buffer layered unit 130 due to the compressive strain to be built therein.

It should be noted that, the number of the multiple quantum well in the buffer layered unit 130 and the graded aluminum content thereof are not limited to those disclosed above, and may be modified according to practical requirements.

In steps e), c), and d), the high-resistance GaN layer 160, the channel layer 140, and the barrier layer 150 of the third embodiment are formed under the same conditions as those for forming the high-resistance GaN layer 160, the channel layer 140, and the barrier layer 150 of the second embodiment.

In sum, the epitaxial structure for the high-electron-mobility transistor and the manufacturing method thereof according to the present disclosure have the following advantages.

First of all, since there is a great difference in spontaneous polarization coefficients between AlN-based material and GaN-based material (0.029 $C/m^2$ to 0.081 $C/m^2$), epitaxial growth of graded AlGaN materials with gradually decreasing (or increasing) Al and Ga contents can generate negative (or positive) residual polarization charges due to the difference in polarized intensities, so as to achieve n/p type doping (i.e., polarization doping) without introducing donor/acceptor dopants, thereby obtaining p-type AlGaN layer (or n-type AlGaN layer). Therefore, by forming the buffer layered unit 130 using polarization doping, the problem of contamination of the reaction chamber due to memory effect of the impurities generated by metallic dopants present in the conventional method for forming the GaN-based buffer layer, may be avoided. In addition, the process for manufacturing the epitaxial structure using polarization doping can be better controlled since it is a relatively simple process compared to the conventional method for manufacturing the conventional epitaxial structure.

Secondly, due to a built-in electric field generated in the p-i-n heterojunction stacks 131 that includes polarization doped n-type and p-type graded AlGaN layers 1311, 1313 and i-type AlGaN layers 1312 with fixed composition, a background carrier concentration contained therein may be greatly reduced, thereby forming the buffer layered unit 130 which has a relatively high resistance and high quality, and which is less prone to electrical leakage.

Lastly, by forming the buffer layered unit 130 that includes a plurality of multiple quantum well structures having graded average aluminum contents, the compressive strain generated by the lattice mismatch among the buffer layered unit 130, the channel layer 140 (GaN), and the nucleation layer (AlN) 120 can be used to effectively buffer the tensile strain generated due to thermal expansion mismatch between the channel layer 140 (GaN) and the substrate (Si) during a cooling process after epitaxial growth under high temperature.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. An epitaxial structure for a high-electron-mobility transistor, comprising:
a substrate; and
a nucleation layer, a buffer layered unit, a channel layer and a barrier layer sequentially disposed on said substrate in such order,
wherein:
said buffer layered unit includes at least one multiple quantum well structure that contains a plurality of p-i-n heterojunction stacks;
each of said p-i-n heterojunction stacks includes a p-type layer that is made of a material represented by a chemical formula of $Al_xGa_{(1-x)}N$, an i-type layer that is made of a material represented by a chemical formula of $Al_yGa_{(1-y)}N$, and an n-type layer that is made of a material represented by a chemical formula of $Al_zGa_{(1-z)}N$, said p-type, i-type and n-type layers in said p-i-n heterojunction stacks being alternately stacked on one another along a direction away from said nucleation layer; and
for each of said p-i-n heterojunction stacks, x gradually decreases in said p-type layer from a first value to a second value along the direction away from said nucleation layer, y is consistent in said i-type layer, $0 \leq y \leq 0.7$, and z gradually increases in said n-type layer from a third value to a fourth value along the direction away from said nucleation layer, said first value ranging from 0.1 to 0.9, said second value ranging from 0 to 0.7, said third value ranging from 0 to 0.7, and said fourth value ranging from 0.1 to 0.9.

2. The epitaxial structure according to claim 1, wherein for each of said p-i-n heterojunction stacks, said p-type layer has a thickness ranging from 5 nm to 50 nm, said i-type layer has a thickness ranging from 5 nm to 50 nm, and said n-type layer has a thickness ranging from 5 nm to 80 nm.

3. The epitaxial structure according to claim 1, wherein said multiple quantum well structure includes 5 to 30 of said p-i-n heterojunction stacks.

4. The epitaxial structure according to claim 1, wherein said buffer layered unit includes a plurality of said multiple quantum well structures, each of which has an average aluminum content, the average aluminum contents in said multiple quantum well structures decreasing in a stepwise manner along the direction away from said nucleation layer.

5. The epitaxial structure according to claim 1, wherein said buffer layered unit further includes a GaN layer which is sandwiched between said multiple quantum well structure and said channel layer.

6. The epitaxial structure according to claim 5, wherein said GaN layer is formed under conditions including a surface temperature ranging from 950° C. to 1000° C. and a low pressure ranging from 40 mbar to 80 mbar.

7. The epitaxial structure according to claim 5, wherein said GaN layer has a thickness ranging from 500 nm to 3000 nm.

8. The epitaxial structure according to claim 1, wherein said substrate is made of a material selected from the group consisting of silicon, silicon carbide, and sapphire.

9. The epitaxial structure according to claim 1, wherein said nucleation layer is made of a material selected from the group consisting of gallium nitride and aluminum nitride.

10. The epitaxial structure according to claim 1, wherein said channel layer is made of gallium nitride and is formed under conditions including a temperature ranging from 1000° C. to 1150° C. and a pressure ranging from 100 mbar to 400 mbar.

11. The epitaxial structure according to claim 1, wherein said channel layer has a thickness ranging from 50 nm to 500 nm.

12. The epitaxial structure according to claim 1, wherein said barrier layer is formed under a temperature ranging from 1000° C. to 1150° C., and is made of a material represented by a chemical formula of $Al_tGa_{(1-t)}N$, where $0.15<t<0.3$.

13. The epitaxial structure according to claim 1, wherein said barrier layer has a thickness ranging from 10 nm to 35 nm.

14. A method for manufacturing the epitaxial structure according to claim 1, comprising the steps of:
 a) forming the nucleation layer on the substrate;
 b) forming the buffer layered unit on the nucleation layer, the buffer layered unit including the at least one multiple quantum well structure that contains the p-i-n heterojunction stacks, each of which is formed by the substeps of:
  b1) forming, by polarization doping, the p-type layer that is made of a material represented by a chemical formula of $Al_xGa_{(1-x)}N$, in which x gradually decreases from a first value to a second value along the direction away from the nucleation layer, the first value ranging from 0.1 to 0.9, the second value ranging from 0 to 0.7,
  b2) epitaxially growing the i-type layer that is made of a material represented by a chemical formula of $Al_yGa_{(1-y)}N$, in which y is consistent and ranges from 0 to 0.7,
  b3) forming, by polarization doping, the n-type layer that is made of a material represented by a chemical formula of $Al_zGa_{(1-z)}N$, in which z gradually increases from a third value to a fourth value along the direction away from the nucleation layer, the third value ranging from 0 to 0.7, and the fourth value ranging from 0.1 to 0.9;
 c) forming the channel layer on the buffer layered unit; and
 d) forming the barrier layer on the channel layer.

15. The method according to claim 14, wherein in substep b1), the p-type layer is formed under conditions including a flow rate of an aluminum source gradually decreasing from a level ranging from 50 sccm to 600 sccm to a level ranging from 0 sccm to 500 sccm, a flow rate of a gallium source gradually increasing from a level ranging from 20 sccm to 80 sccm to a level ranging from 25 sccm to 400 sccm, a flow rate of ammonia ranging from 1500 sccm to 20000 sccm, a surface temperature ranging from 1000° C. to 1100° C., and a growth rate ranging from 0.5 μm/h to 3 μm/h.

16. The method according to claim 14, wherein in substep b2), the i-type layer is formed under conditions including a flow rate of an aluminum source ranging from 0 sccm to 500 sccm, a flow rate of a gallium source ranging from 25 sccm to 400 sccm, a flow rate of ammonia ranging from 1500 sccm to 30000 sccm, a surface temperature ranging from 1000° C. to 1100° C., and a growth rate ranging from 1 μm/h to 3 μm/h.

17. The method according to claim 14, wherein in step b3), the n-type layer is formed under conditions including a flow rate of an aluminum source gradually increasing from a level ranging from 0 sccm to 500 sccm to a level ranging from 50 sccm to 600 sccm, a flow rate of a gallium source gradually decreasing from a level ranging from 25 sccm to 400 sccm to a level ranging from 20 sccm to 80 sccm, a flow rate of ammonia ranging from 1500 sccm to 20000 sccm, a surface temperature ranging from 1000° C. to 1100° C., and a growth rate ranging from 0.5 μm/h to 3 μm/h.

18. The method according to claim 14, further comprising before step c) and after step b), a step e) of forming a GaN layer on the multiple quantum well structure under conditions including a flow rate of a gallium source ranging from 100 sccm to 500 sccm, a flow rate of ammonia ranging from 10000 sccm to 15000 sccm, a surface temperature ranging from 950° C. to 1000° C., a pressure ranging from 10 mbar to 80 mbar, and a growth rate ranging from 1.5 μm/h to 3 μm/h.

19. The method according to claim 14, wherein in step c), the channel layer is formed under conditions including a flow rate of a gallium source from 60 sccm to 400 sccm, a flow rate of ammonia ranging from 1500 sccm to 30000 sccm, a surface temperature ranging from 950° C. to 1100° C., and a growth rate ranging from 0.5 μm/h to 3 μm/h.

20. The method according to claim 14, wherein in step d), the barrier layer is formed under conditions including a flow rate of an aluminum source ranging from 80 sccm to 250 sccm, a flow rate of a gallium source ranging from 60 sccm to 150 sccm, a flow rate of ammonia ranging from 6000 sccm to 12000 sccm, a surface temperature ranging from 1020° C. to 1100° C., and a growth rate ranging from 0.3 μm/h to 3 μm/h.

* * * * *